(12) United States Patent
Shan et al.

(10) Patent No.: US 8,797,019 B2
(45) Date of Patent: Aug. 5, 2014

(54) HANDHELD FIBER OPTIC CURRENT AND VOLTAGE MONITOR FOR HIGH VOLTAGE APPLICATIONS

(76) Inventors: Xuekang Shan, San Diego, CA (US); Jin Hao, San Diego, CA (US)

( * ) Notice: Subject to any disclaimer, the term of this patent is extended or adjusted under 35 U.S.C. 154(b) by 128 days.

(21) Appl. No.: 13/609,685

(22) Filed: Sep. 11, 2012

(65) Prior Publication Data

US 2014/0070792 A1 Mar. 13, 2014

(51) Int. Cl.
*G01R 19/00* (2006.01)
(52) U.S. Cl.
USPC .......................................................... 324/96
(58) Field of Classification Search
USPC ................ 324/96, 762.01–762.1, 97, 74
See application file for complete search history.

(56) References Cited

U.S. PATENT DOCUMENTS 5,553,173 A * 9/1996 Lutz et al. ...................... 385/12
6,434,285 B1 * 8/2002 Blake et al. ..................... 385/12

* cited by examiner

*Primary Examiner* — Tung X Nguyen

(57) ABSTRACT

A handheld fiber optic current and voltage monitor for applications in high voltage environment. A light source generates constant optical signal that is split by a fiber optic splitter into two paths. One path feeds a DMEMS based current sensor that is driven by a current to voltage conversion device that converts the current in a conductor into a voltage. The other path goes to a DMEMS based electric field sensor driven by a condenser antenna that converts the electric field near a high voltage power line conductor into a voltage. The output optical signals from the current sensor and the electric field sensor are received by respective optical receivers and converted into electric signals. A signal processing unit processes the signals, and a display screen displays the results. All these are mounted on a plastic mast for handheld operation.

2 Claims, 4 Drawing Sheets

HANDHELD FIBER OPTIC CURRENT AND VOLTAGE MONITOR FOR HIGH VOLTAGE APPLICATIONS

BACKGROUND OF THE INVENTION

The power industry and the fast developing high speed railway systems need handy tools for high voltage transmission line service, fault location and repair. A mongst various tools, a portable current and voltage monitor is the most desirable. Instruments similar to clamp current meters would find wide applications, because they don't need a direct ground connection and there is not need to disconnect or cut the power liner. In order to work on live power lines, these instruments must be able to withstand high voltage, normally, up to 1 million volts.

In the past few decades, fiber optic current transformers and voltage transformers have attracted much attention, due to their natural suitability for working in HV environment. Such transformers have already been employed in power stations.

Commercial fiber optic current/voltage transformers are mainly designed for permanent installation, not for mobile applications. This is because these transformer are bulky and because the power lines need disconnection during these transformers' installation.

Some types of portable fiber optic current/voltage transformers are proposed, and there are commercial vehicle borne optical current or voltage sensors for applications on up to 500 kV power lines (1, 2). These instruments are highly accurate and they are suitable for on site calibration purposes. However, they are bulky and expensive, and it is not so easy and convenient to wrap the sensing fiber head on an energized conductor. Therefore, their mobility is limited and they are not suitable for maintenance and repair work. A handheld instrument is more desirable than the vehicle borne transformers.

Traditionally, electric current flowing in a power line can be measured in one of the following three ways without disconnecting the conductor:

1. Using a split iron core current transformer. Clamp Ammeters use this method;
2. Using a split (air core) Rogowski coil and an integrator. This method avoids magnetic saturation suffered by iron core current transformer;
3. Measuring the voltage drop across a certain length of the conductor. When the contact points move along the conductor, the relative change of measured voltage reflects the resistance of the conductor and thus wire damage can be located.

The above mentioned methods can be combined with fiber optic technology to make fiber optic current sensors. Because both electric and optic means are used, this type of fiber optic current sensor is called hybrid type.

A prior art (3) proposed an AC current sensor based on Diffractive Microelectromechanical systems (DMEMS) device. The DMEMS device is a variable optical attenuator, which attenuates the input optical signal by a control electric signal. In the proposed current sensor, the DMEMS device modulates the input constant optical signal according to an AC voltage which is generated by a current transformer or an air core Rogowski coil. The DMEMS device has a very high electric impedance, and therefore it consumes negligible electric power of micro Watts. A DC bias of 5-6 volts and an AC drive voltage of no more than 1 volt peak to peak are adequate for the sensor to work. One of the major advantages of this type of optical current sensor is that it requires very little electrical power. Therefore power supply for HV side circuitry is greatly simplified compared conventional hybrid fiber optic current sensors. A battery of one Amp hour capacity will keep the sensor working for many years. Another prior art (4) described an electric field sensor also based on the DMEMS device. The electric field sensor head includes a condenser antenna, a DC bias, and a DMEMS device. The condenser antenna picks up electric field and turns it into a voltage. This voltage then drives the DC biased DMEMS device, and an optical receiver recovers the voltage that is applied to the DMEMS device which represents the electric field strength.

This invention describes a handheld fiber optic current and voltage monitor for applications in HV environment.

The current sensor is DMEMS device based. It includes

The voltage sensor is based on an electric field sensor which employs a DMEMS device in the sensor head.

When the electric field strength near a power line is measured, the voltage on the power line can be calculated.

Every energized conductor generates an electric field around it. For a round conductor with infinite length, the electric field is:

$$E = \frac{q}{r},$$

where q is the electric charge per unit length, and r is the distance from the conductor center.

A convenient way to measure the electric field of a energized power line is to place the measuring sensor in close proximity to the line. However, power line conductors have various diameters. Therefore, the measured electric field strength will have vastly different values when the line voltage and the light from ground are the same but the conductor has a different thickness. For example, electric field measured on a 30 mm thick conductor will be only ⅔ that measured on a 20 mm thick wire given that other parameters are identical. This would lead to intolerable errors if the line voltage is calculated from the measured electric field.

This invention proposes a simple method to overcome this error. A split metal cylinder is clamped on to the conductor wire, and thus the cylinder has an identical electric potential as the conductor wire. The electric field is measured near the surface of the cylinder. Therefore, no matter what the wire's diameter is, the wire will have an effective diameter of the cylinder. Errors caused by different wire diameters are thus eliminated.

DETAILED DESCRIPTION OF THE FIRST PREFERRED EMBODIMENT

Figure 1:
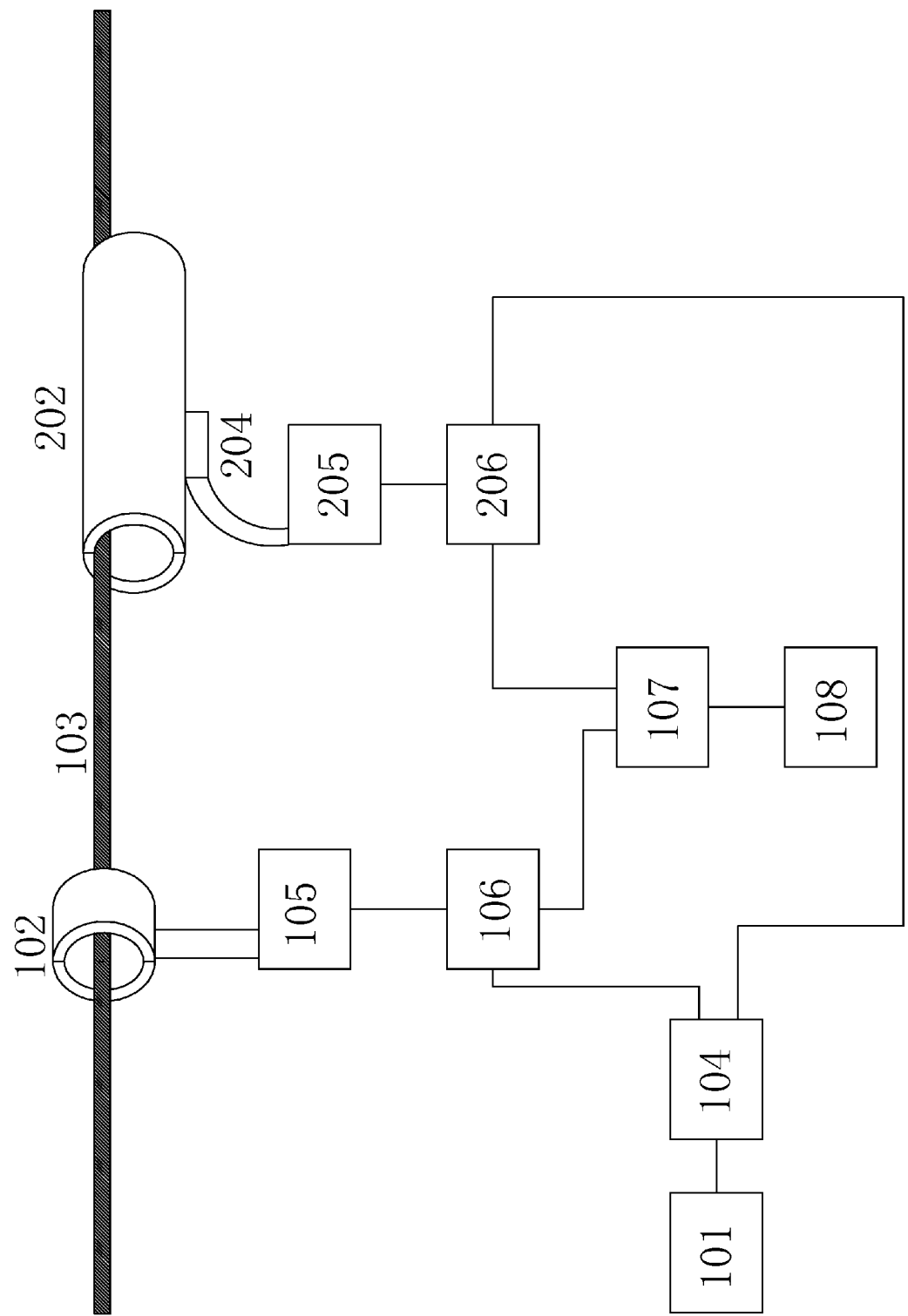
FIG. 1 shows a current/voltage monitor employing a split core current transformer to detect current in a power line and a split metal cylinder clamped on the power line for electric field measurement.
Figure 2:
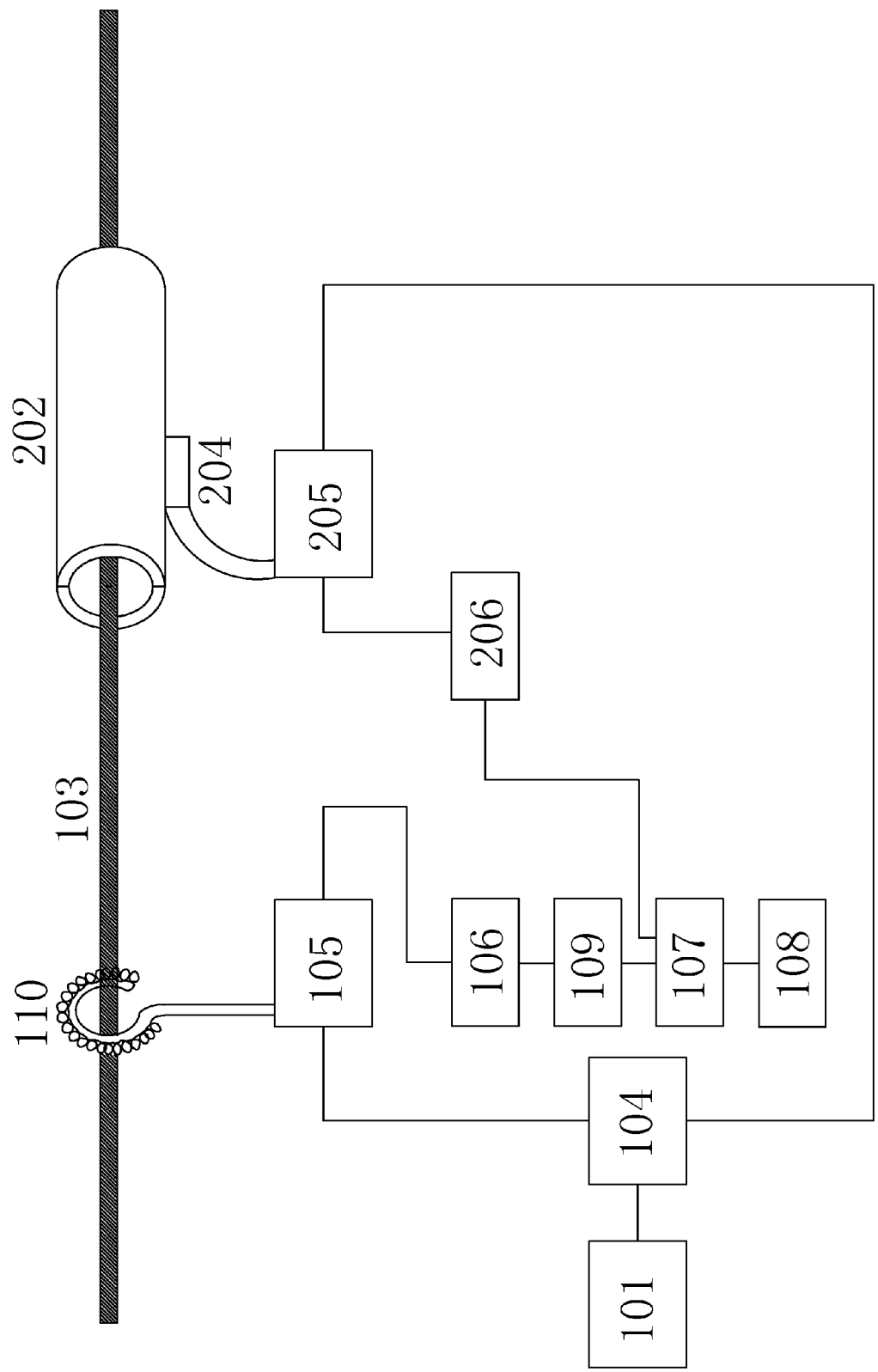
FIG. 2 shows a current/voltage monitor employing a split Rogowski coil to detect current in a power line and a split metal cylinder clamped on the power line for electric field measurement.
Figure 3:
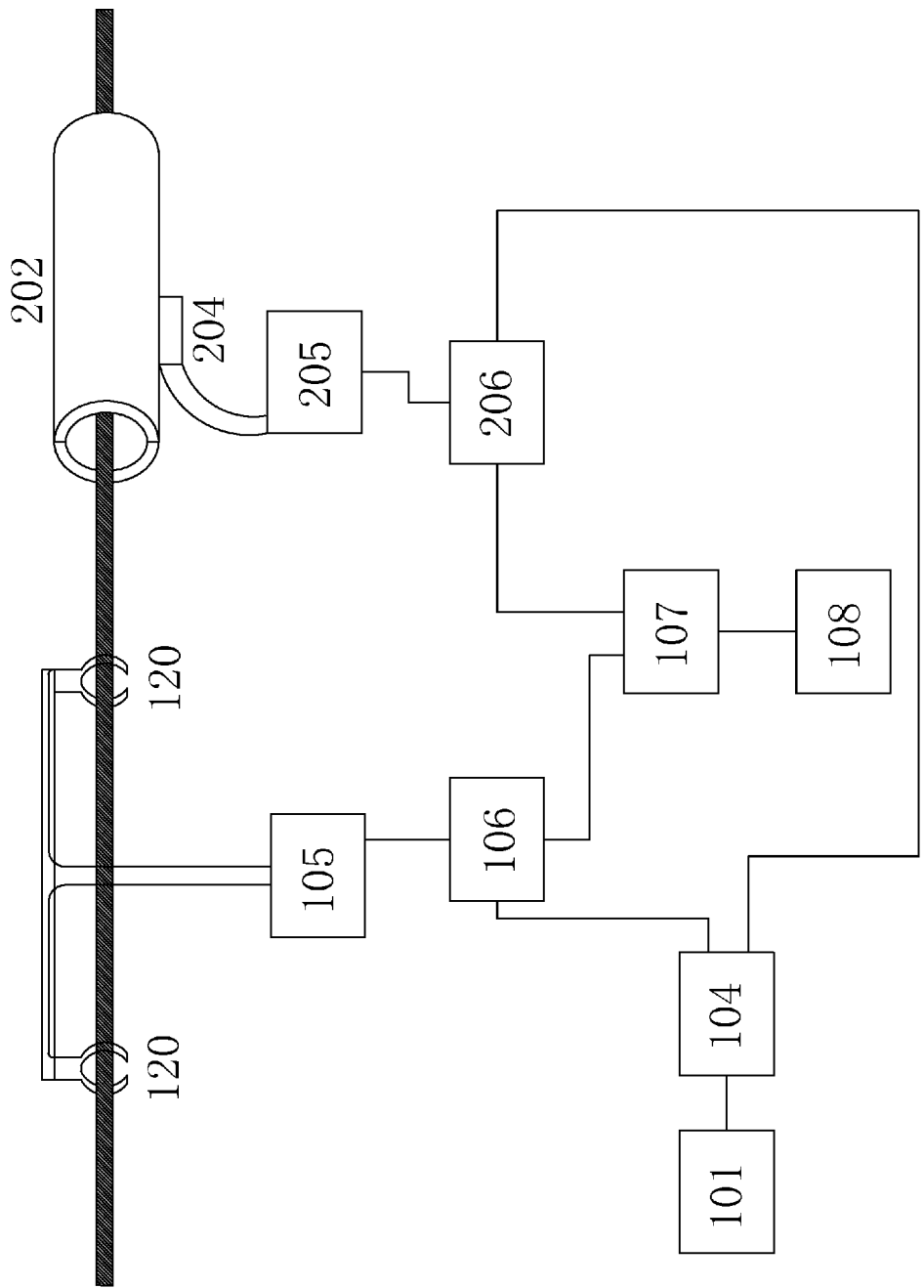
FIG. 3 shows a current/voltage monitor employing two electrical contact electrodes to detect voltage drops on the power line for current measurement and a split metal cylinder clamped on the power line for electric field measurement.
Figure 4:
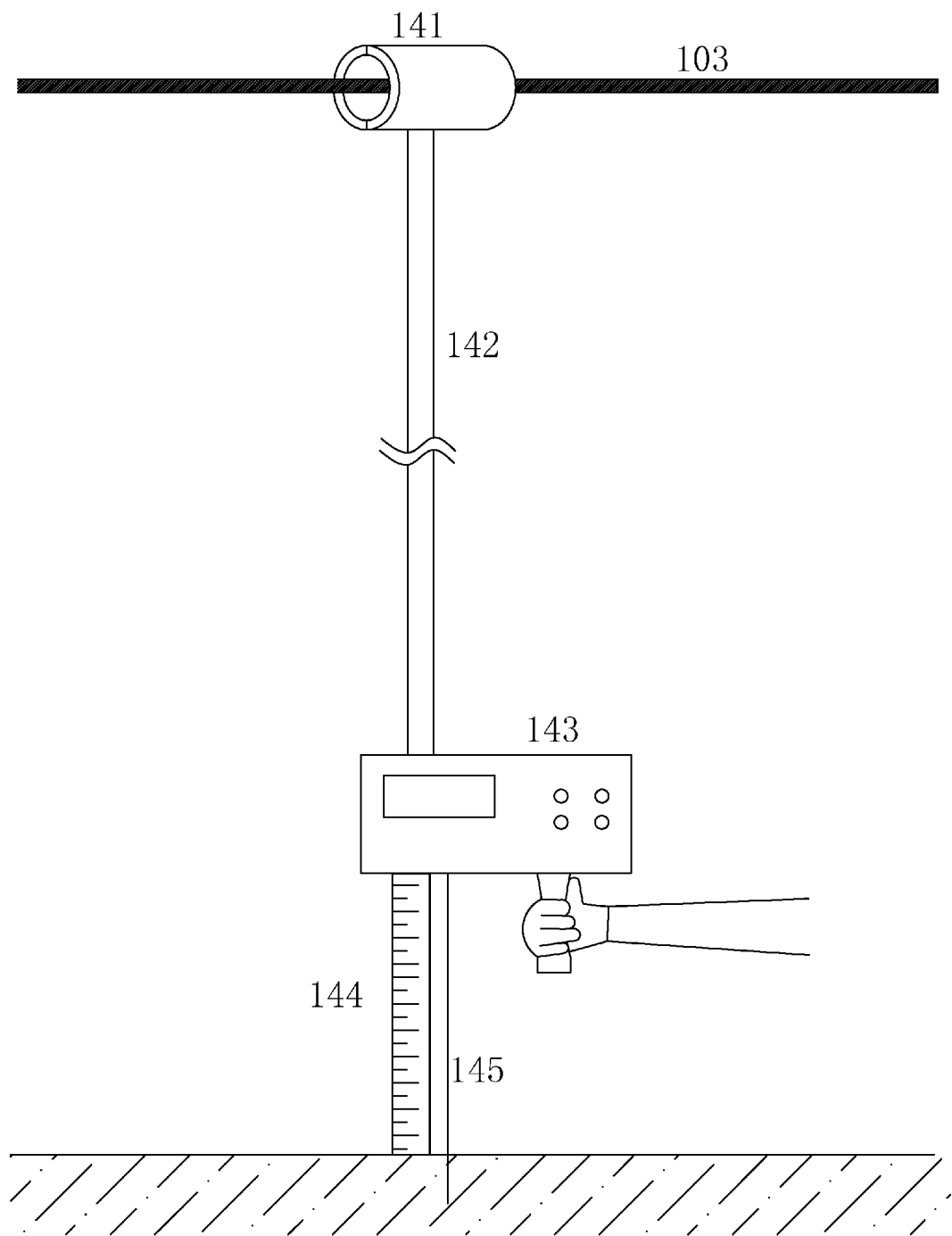
FIG. 4 shows the current/voltage monitor 141 mounted on the top end of a plastic mast 142 for handheld operation. A box 143 containing a display screen and electronic circuitry is mounted on the bottom end of the mast. A measuring tape 144 is attached to the bottom box. There is also an optional grounding connector 145.

A hand held fiber optic current and voltage monitor has a current sensor and a electric field sensor. The current sensor is based on a DMEMS device. It includes a light source 101, a split core current transformer 102 clamped on a current carrying conductor 103, a fiber optic splitter 104, a DMEMS device 105, an optical receiver 106, a signal processing unit 107, and a display screen 108. All the above mentioned components are mounted on a plastic mast 142 for handheld operation.

The split core current transformer turns the current flowing in the conductor into a voltage, which drives the DMEMS device. The DMEMS device then modulates the constant light from the light source via the fiber optic splitter such that the optical receiver receives an optical signal which changes in intensity according to the voltage applied to the DMEMS device. After signal processing, the electric current in the conductor is measured and displayed on the screen.

The electric filed sensor is based on a DMEMS device. It shares the light source 101 with the current sensor via a fiber optic splitter 104. It also includes a split metal cylinder 202 clamped on the current carrying conductor 103, a condenser antenna 204, a DMEMS device 205, and an optical receiver 206. It shares the signal processing unit 107 and the display screen 108 with the current sensor. It also has a length measuring tape 144.

All the above mentioned components are mounted on a plastic mast 142 for handheld operation.

The split metal cylinder clamps on the energized power line, and the condenser antenna detects the electric field and turns it into a voltage. This voltage then drives the DMEMS device, which modulates the constant light from the light source. The optical receiver converts the received optical signal into electric signal. The signal processing unit then calculates measured electric filed strength. Since the diameter of the split metal cylinder is known, and the distance from the condenser antenna to the ground is measured by the measuring tape, the voltage on the power line can be calculated from the measured electric field strength.

DETAILED DESCRIPTION OF THE SECOND PREFERRED EMBODIMENTS

In another preferred embodiment, the current sensor is based on a DMEMS device. It includes a light source 101, a split Rogowski coil 110 clamped on a current carrying conductor 103, a fiber optic splitter 104, a DMEMS device 105, an integrator circuitry 109, an optical receiver 106, a signal processing unit 107, and a display screen 108.

The split Rogowski coil detects the time change rate of the current, and turns this rate into a voltage. The advantage of the Rogowski coil is that it does not saturate when it is subject to large currents. Because it detects the time change rate of the magnetic flux, an integrator circuit is needed for the output of the Rogowski coil to reproduce the current waveform. The output voltage of the integrator drives the DMEMS device, and the DMEMS device then modulates the constant light from the light source via the fiber optic splitter such that the optical receiver receives an optical signal which changes in intensity according to the voltage applied to the DMEMS device. After signal processing, the electric current in the conductor is measured and displayed on the screen.

In this embodiment, the voltage sensor is the same as described in the first preferred embodiment.

DETAILED DESCRIPTION OF THE THIRD PREFERRED EMBODIMENTS

In still another embodiment, the current sensor is based on a DMEMS devise. It includes a light source 101, two detachable contact electrodes 120, a fiber optic splitter 104, a DMEMS device 105, an integrator circuitry 109, an optical receiver 106, a signal processing unit 107, and a display screen 110. The separation of the two electric contacts is fixed or adjustable.

The detachable electric contact pair is placed on the current carrying conductor 103. When electric current flows through the conductor, a voltage drop is generated along it, due to its resistance. Voltage drops of tens of mV to hundreds of mV per meter are common on power lines carrying thousands of amperes. This voltage range is sufficient to drive the DMEMS device to generate useful optical signals, and this voltage rang can also be adjusted by changing the separation of the two contacts. Since the DMEMS device has an input impedance of the order of mega ohms, the contact resistance between the contact pair and the conductor can be completely neglected. For fault location, relative voltage variations measured in this way along a conductor is far more important then an absolute accurate voltage. For example, if there is wire damage on the conductor, the damaged part has a larger resistance than other parts. Or if an insulator is leaking, the currents on each side of the insulator will be unequal. In either case, it is easy to locate the damage or leakage using this method, since one only needs to measure the voltage variation along the conductor, not the absolute voltage.

In this embodiment, the voltage sensor is the same as described in the first preferred embodiment.

SUMMARY OF THE INVENTION

This invention describes a handheld fiber optic current and voltage monitor for applications in high voltage environment. The monitor is clamp on type. The current sensor is based on DMEMS and is connected to a split core conventional current transformer, or a split Rogowski coil, or two contact electrodes positioned along a power line conductor. The voltage sensor is also based on the DMEMS and is connected to a condenser antenna attached to a split metal cylinder. The split core current transformer or the split Rogowski coil, and the split metal cylinder are clamped on a power line, and the current and voltage on the line are measured.

The invention claimed is:
1. A handheld fiber optic current and voltage monitor for high voltage applications that comprises:
   a light source that emits a constant optical power;
   an optical splitter that divides the light from said light source into two paths;
   an electric current to voltage conversion device that converts electric current flowing in a conductor into a voltage;
   a DMEMS based fiber optic current sensor that is driven by said electric current to voltage conversion device and that modulates input constant optical power from said light source via said optical splitter;
   an optical receiver that converts received optical signal from said DMEMS based fiber optic current sensor to electric signal;

a split metal cylinder that can be clamped on a power line;

a DMEMS based fiber optic electric field sensor;

an optical receiver that converts received optical signal from said DMEMS based fiber optic electric field sensor into electrical signal;

a signal processing unit that processes said electrical signals;

a display screen that displays the measured current and voltage;

a measuring tape that hangs from the display screen housing to measure the distance from the ground; and a plastic mast that holds the sensors, the circuit boards, and the display screen for handheld operation.

2. The handheld fiber optic current and voltage monitor as in claim 1, wherein said electric current to voltage conversion device is a split core current transformer to wrap on a power line, or a splitter core Rogowski coil to wrap on a power line, or two detachable contact electrodes to be placed on a power line.

* * * * *